(12) United States Patent
Jiang et al.

(10) Patent No.: US 7,701,372 B1
(45) Date of Patent: Apr. 20, 2010

(54) APPARATUS AND METHODS FOR SAFE-MODE DELTA-SIGMA MODULATORS

(75) Inventors: Ruoxin Jiang, Austin, TX (US);
Xiaodong Wang, Austin, TX (US);
Gregory Uehara, Austin, TX (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/145,965

(22) Filed: Jun. 25, 2008

Related U.S. Application Data

(60) Provisional application No. 60/946,282, filed on Jun. 26, 2007.

(51) Int. Cl.
*H03M 3/00* (2006.01)

(52) U.S. Cl. .................................. 341/143; 341/155
(58) Field of Classification Search ................. 341/143, 341/155
See application file for complete search history.

(56) References Cited

U.S. PATENT DOCUMENTS

| | | | | |
|---|---|---|---|---|
| 5,079,550 | A * | 1/1992 | Sooch et al. | 341/143 |
| 5,917,440 | A * | 6/1999 | Khoury | 341/143 |
| 6,693,572 | B1 * | 2/2004 | Oliaei et al. | 341/143 |
| 7,042,377 | B2 * | 5/2006 | Oliaei | 341/143 |

* cited by examiner

*Primary Examiner*—Jean B Jeanglaude

(57) ABSTRACT

A delta-sigma modulator includes two integrators. One of the two integrators is lossy. The lossy integrator may be a continuous-time integrator, or a discrete-time integrator. Use of the lossy integrator maintains stability of the delta-sigma converter over a relatively wide range of input signals.

40 Claims, 7 Drawing Sheets

APPARATUS AND METHODS FOR SAFE-MODE DELTA-SIGMA MODULATORS

CROSS-REFERENCE TO RELATED APPLICATIONS

This application claims priority to, and incorporates by reference, U.S. Provisional Patent Application Ser. No. 60/946,282, filed on Jun. 26, 2007, titled "Safe Mode for Delta Sigma Modulators".

TECHNICAL FIELD

The disclosed concepts relate generally to data converters and modulators and, more particularly, to apparatus and methods for safe-mode delta-sigma modulators.

BACKGROUND

Delta-sigma modulators are ubiquitous circuits that find application in a relatively large number of electronic circuits and systems. For example, one may use delta-sigma modulators in analog-to-digital converters (ADCs), digital-to-analog converters (DACs), and the like.

Advances in semiconductor fabrication technology, for example, the commonly available complementary metal oxide semiconductor process, have made producing delta-sigma modulators more wide-spread.

SUMMARY

The disclosed concepts relate generally to data converters and modulators and, more particularly, to apparatus and methods for safe-mode delta-sigma modulators. In one exemplary embodiment, a delta-sigma modulator includes two integrators. One of the integrators is a lossy integrator. In another illustrative embodiment, an analog-to-digital converter (ADC) includes a delta-sigma modulator. The delta-sigma modulator includes at least one integrator with a lossy transfer function. In yet another exemplary embodiment, a method of maintaining stability of a delta-sigma modulator includes selectably integrating a signal within the delta-sigma modulator to generate another signal. The first signal is selectably integrated using at least one of a lossy integrator and a lossless integrator.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to data converters and modulators and, more particularly, to apparatus and methods for safe-mode delta-sigma modulators. More specifically, the disclosed concepts provide apparatus and methods for delta-sigma modulators with improved stability under a relatively wide range of operating conditions.

Broadly speaking, the disclosed concepts contemplate using at least one lossy integrator in a delta-sigma modulator. The use of the lossy integrator(s) improves the stability of the modulator, e.g., an unconditionally stable modulator, or safe-mode modulator. In wireless and cellular applications, the improved stability provides more reliable communications, for example, between a mobile device and a base station.

Figure 1:
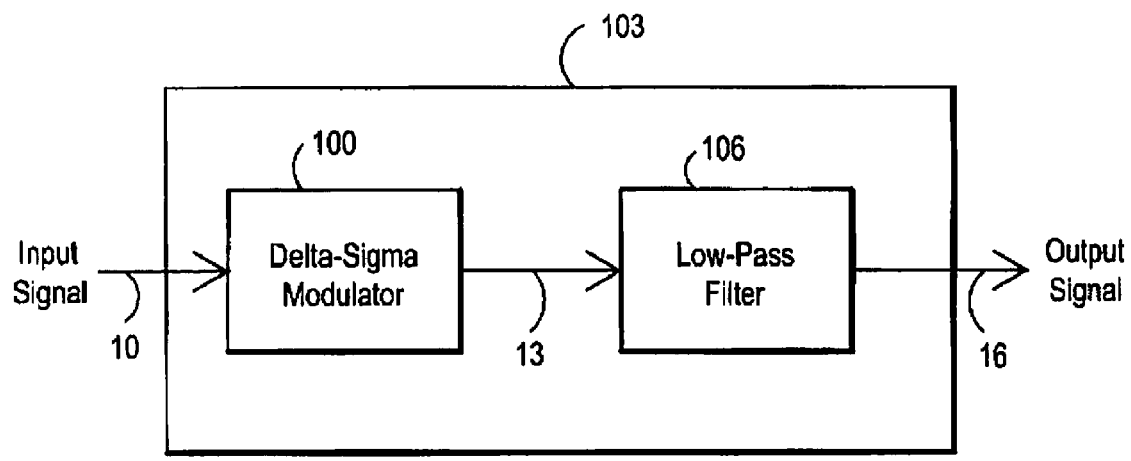
FIG. 1 illustrates a simplified block diagram of a circuit for processing signals according to an illustrative embodiment.

FIG. 1 illustrates a simplified block diagram of a circuit for processing signals according to an illustrative embodiment. Signal processor 103, for example, an ADC, includes delta-sigma modulator 100 and filter 106. Delta-sigma modulator 100 includes at least one lossy integrator. Delta-sigma modulator 100 accepts an input signal 10, processes the input signal, and produces an output signal 13. Filter 106 accepts output signal 13 of delta-sigma modulator 100, performs low-pass filtering of output signal 13, and provides the resulting signal as output signal 16 of signal processor 103.

In one embodiment, signal processor 103 constitutes an ADC. The input signal, e.g., an analog signal, drives the input of delta-sigma modulator 100. In response, delta-sigma modulator 100 converts input signal 10, produces an output signal in the form of a bit-stream at its output signal 13. Filter 106 filters output signal 13 of delta-sigma modulator 100 to produce the final output signal 16 of signal processor 103.

Figure 2:
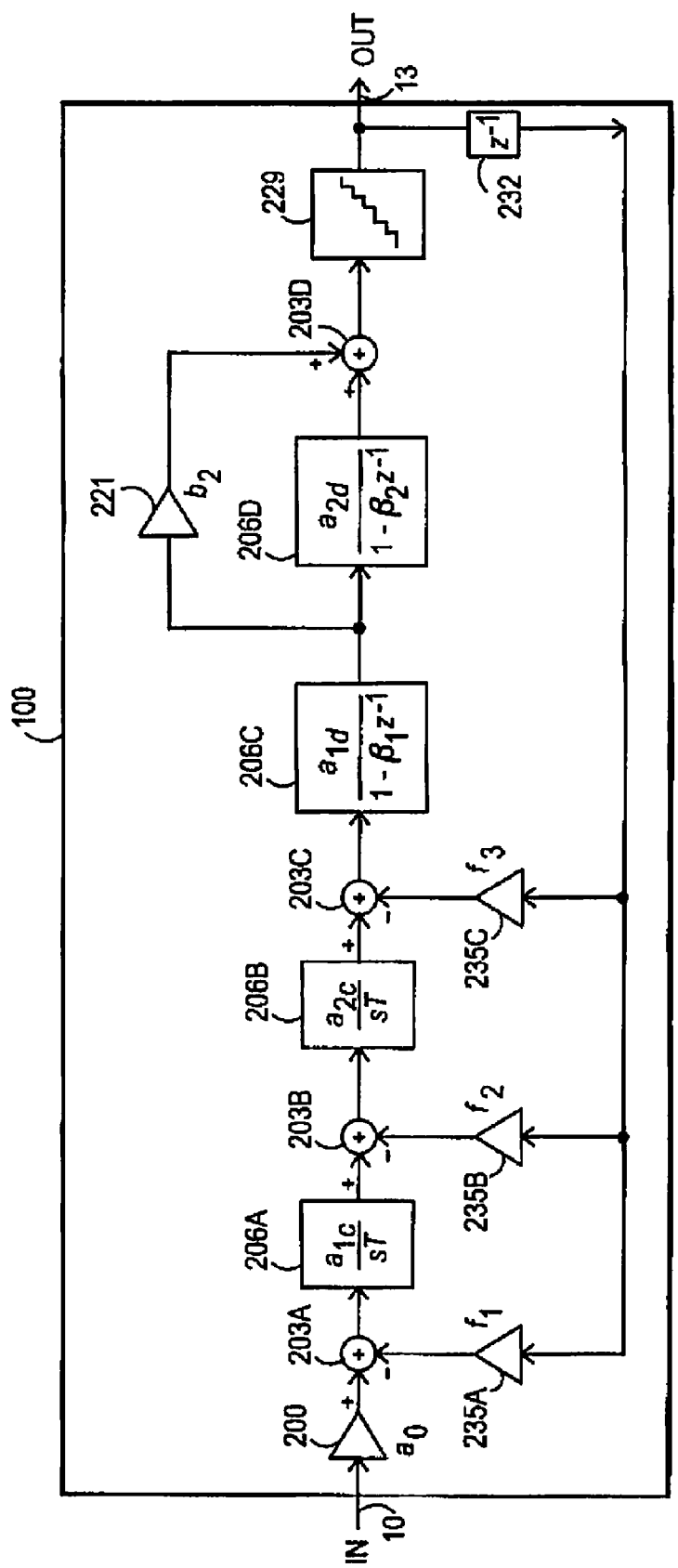
FIG. 2 depicts a more detailed block diagram of a delta-sigma modulator according to an illustrative embodiment.

FIG. 2 depicts a more detailed block diagram of a delta-sigma modulator according to an illustrative embodiment. Delta-sigma modulator 100 includes continuous-time integrators 206A-206B, and discrete-time integrators 206C-206D, coupled in a cascade configuration. Delta-sigma modulator 100 also includes gain blocks or circuits 200, 221, and 235A-235C. In addition, delta-sigma modulator 100 includes summing circuits 203A-203D, quantizer 229, and delay block or circuit 232.

Generally speaking, gain circuits 200, 221, and 235A-235C may constitute coefficients in an overall transfer function of delta-sigma modulator 100. The coefficients determine, in part, the location of the poles and zeroes of the transfer function and, hence, the stability of delta-sigma modulator 100.

Gain circuit 200, with a gain of $a_0$, accepts the input signal of delta-sigma modulator, applies the gain $a_0$ to it, and provides the resulting signal to summing circuit 203A. Gain circuits 235A-235C, with gains of $f_1$ through $f_3$, respectively, are arranged in a feedback loop, and scale the output of delay circuit 232, and provide the resulting signal to summing circuits 203A-203C.

Summing circuit 203A provides at its output the difference between the output signal of gain circuit 200 and the output signal of gain circuit 235A. Integrator 206A accepts the output signal of summing circuit 203A, processes that signal, and provides an output signal to summing circuit 203B. Integrator 206A has a transfer function given by:

$$\frac{a_{1c}}{sT},$$

where $a_{1c}$ denotes a continuous-time coefficient, s represents the Laplace variable, and T denotes a time unit or sampling interval.

Similar to summing circuit 203A, summing circuit 203B generates an output signal that equals the difference between the output signal of integrator 206A and the output signal of gain circuit 235B.

Integrator 206B accepts as its input the output signal of summing circuit 203B, processes that signal, and provides an output signal to summing circuit 203C. Integrator 206B has a transfer function given by:

$$\frac{a_{2c}}{sT},$$

where $a_{2c}$ denotes a continuous-time coefficient, s represents the Laplace variable, and T denotes a time unit or sampling interval. Summing circuit 203C subtracts the output signal of gain circuit 235C from the output signal of integrator 206B, and provides the resulting signal to integrator 206C.

Integrator 206C receives the output signal of summing circuit 203C, processes it, and provides the resulting signal to integrator 206D and gain circuit 221. Integrator 206C has a transfer function given by:

$$\frac{a_{1d}}{1 - \beta_1 z^{-1}},$$

where aid denotes $a_{1d}$ discrete-time coefficient, $\beta_1$ represents a coefficient, and $z^1$ denotes a unit delay. Note that if one selects a value of unity for $\beta_1$, then integrator 206C constitutes a lossless integrator. Conversely, a value of $\beta_1$ less than unity makes integrator 206C a lossy integrator.

Integrator 206D receives the output signal of integrator 206C, processes it, and provides the resulting signal to summing circuit 203D. Integrator 206D has a transfer function given by:

$$\frac{a_{2d}}{1 - \beta_2 z^{-1}},$$

where $a_{2d}$ denotes a discrete-time coefficient, $\beta_2$ represents a coefficient, and $z^{-1}$ denotes a unit delay. Similar to integrator 206C, a value of unity for $\beta_1$ results in a lossless 206D, whereas a value of $\beta_2$ less than unity makes integrator 206D a lossy integrator.

Gain circuit 221 scales the output signal of integrator 206C, and provides the resulting signal to another input of summing circuit 203D. Put another way, gain circuit 221 acts as a feed-forward circuit.

Summing circuit 203D adds its two input signals and provides the sum of them to quantizer 229. Quantizer 229 quantizes the output signal of summing circuit 203D, and generates the output signal 13 of delta-sigma modulator 100. As persons of ordinary skill in the art who have the benefit of the description of the disclosed concepts understand, quantizer 229 may use a variety of quantization levels, as desired.

Delay circuit 232 (with a transfer function of $Z^1$ in the embodiment shown) accepts the output signal of quantizer 229 (quantizer 229 is assumed to have no delay), and delays it by a desired time period (e.g., one time unit or one clock signal), to produce a delayed output signal. Delay circuit 232 provides the delayed output signal to gain circuits 235A-235C.

As noted, delta-sigma modulators according to the disclosed concepts include at least one lossy integrator. Thus, in the embodiment shown in FIG. 2, integrator 206C, integrator 206D, or both, constitute lossy integrators. One may make an integrator lossy by selecting an appropriate value of the coefficient in the denominator of the integrator's transfer function (i.e., $\beta_1$ or $\beta_2$), as persons of ordinary skill in the art who have the benefit of the description of the disclosed concepts understand.

Note that, rather than using one or more lossy discrete-time integrators, one may use one or more lossy continuous-time integrators (e.g., integrator 206A, integrator 206B, or both), as desired. Typically, a lossy discrete-time integrator has more stable, repeatable, and/or reliable performance characteristics than a lossy continuous-time integrator, as persons of ordinary skill in the art who have the benefit of the description of the disclosed concepts understand.

As persons of ordinary skill in the art who have the benefit of the description of the disclosed concepts understand, using one or more lossy integrators may reduce the overall gain of delta-sigma modulator 100. On the other hand, using one or more lossy integrators causes the poles of the transfer function of delta-sigma modulator 100 to remain within the unit circle. Consequently, delta-sigma modulator 100 maintains stability even for relatively large signals.

Figure 3:
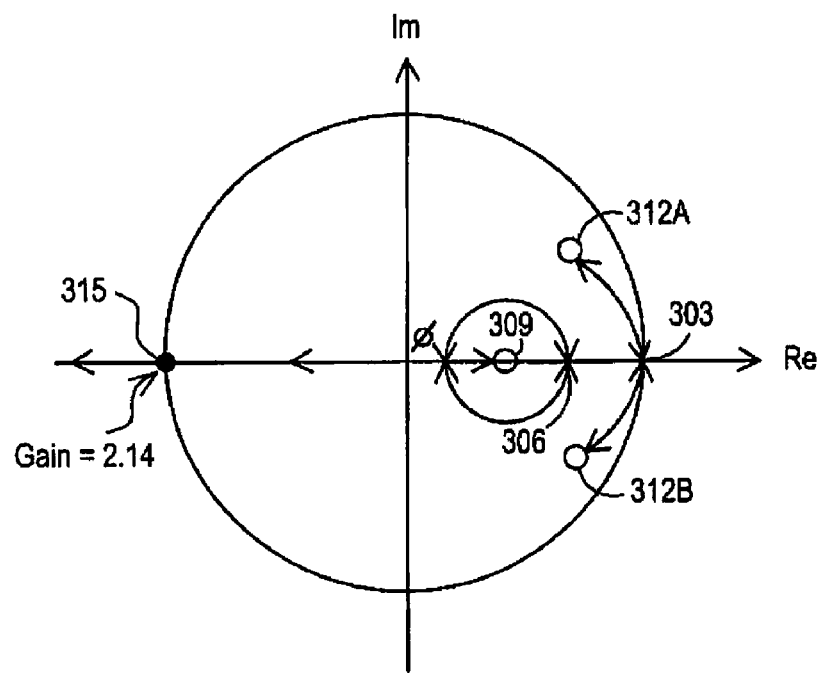
FIG. 3 shows a root-loci plot for a delta-sigma modulator according to an exemplary embodiment.

FIG. 3 shows a root-loci plot for a delta-sigma modulator according to an exemplary embodiment, for example, the embodiment shown in FIG. 2. The delta-sigma modulator has at least one lossy integrator. The root-loci plot indicates that the transfer function of the delta-sigma modulator has four poles. Two poles reside at point 303.

In response to changes in the gain of the quantizer circuit (e.g., quantizer circuit 229 in FIG. 2), the two poles may move to locations 312A and 312B, respectively, where two zeros of the transfer function of the delta-sigma modulator reside.

Two other poles reside at point 306. In response to variations in the gain of the quantizer circuit (e.g., quantizer circuit 229 in FIG. 2), the poles may move from point 306 to point 309, and then move towards point 315. Two zeros of the transfer function reside at point 309 on the root-loci plot. As the root-loci plot shows, the poles remain inside the unit circle. Thus, the delta-sigma modulator remain stable under varying operating conditions.

Note that some values of the quantizer gain may make the delta-sigma modulator unstable. For example, for the delta-sigma modulator corresponding to the root-loci plot in FIG. 3, a quantizer gain of about 2.14 causes two of the poles to move beyond point 315, i.e., outside the unit circle. Under those circumstances, the delta-sigma modulator becomes unstable.

By choosing appropriate values of the quantizer gain, however, one may maintain the stability of the delta-sigma modulator. One may select such values of the quantizer gain by taking into consideration various factors, such as the design and performance characteristics desired for each particular application. The desired characteristics affect the choice of component values and, thus, the locations of the poles and zeros of the transfer function of the delta-sigma modulator. The location of the poles and zeros in turn affect the appropriate values for the quantizer gain. The details of designing the appropriate quantizer fall within the level of skill and knowledge of persons of ordinary skill in the art who have the benefit of the description of the disclosed concepts.

Figure 4:
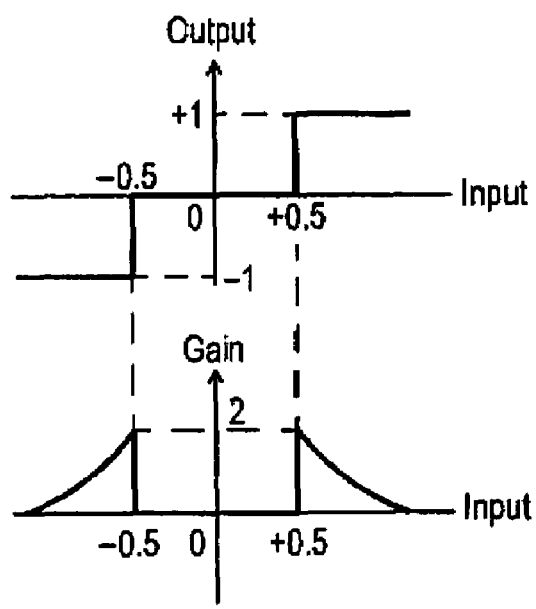
FIG. 4 shows plots of output signal and gain for a quantizer suitable for use in delta-sigma modulators according to exemplary embodiments.

Furthermore, one may use a variety of quantizer topologies and architectures, as desired. For example, in illustrative embodiments, one may use a three-level quantizer, known to persons of ordinary skill in the art who have the benefit of the description of the disclosed concepts. FIG. 4 shows plots of output signal and gain for such a three-level quantizer.

As the plot of the output signal as a function of the input signal shows, for input signals between −0.5 and +0.5 (the input signal may have a desired unit, say, Volts), the quantizer's output signal is zero. For input signals below −0.5, the quantizer produces a −1 output signal, whereas for input signals more than +0.5, the quantizer has an output signal of +1.

The lower plot shows the gain (large signal gain, or the ratio of the output signal to the input signal) of the quantizer. Note that the gain peaks around the deflection points in the output signal, i.e., for input values of −0.5 and +0.5. Note also that the gain does not exceed 2, which leads to stability of the delta-sigma modulator.

Although FIG. 2 shows a delta-sigma modulator with four integrators (two continuous-time and two discrete-time), one may apply the disclosed concepts to a variety of delta-sigma modulators, as persons of ordinary skill in the art who have the benefit of the description of the disclosed concepts understand.

Figure 5A:
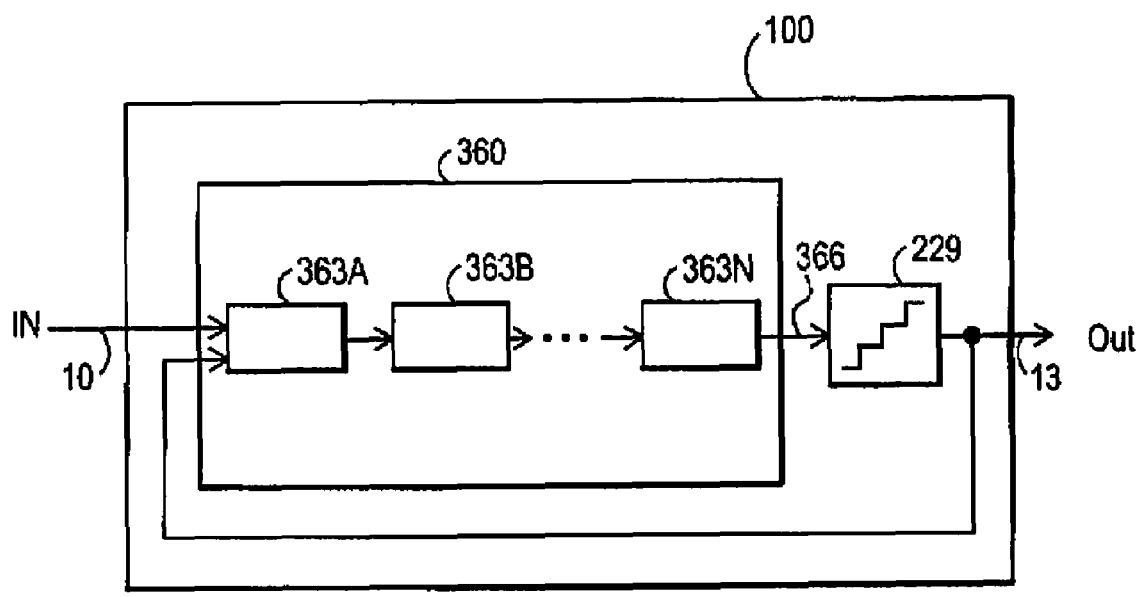
FIG. 5A depicts a simplified block diagram of a generalized delta-sigma modulator according to an illustrative embodiment.

FIG. 5A depicts a simplified block diagram of a generalized delta-sigma modulator 100 according to an illustrative embodiment. Delta-sigma modulator 100 includes loop filter 360, and quantizer 229. Loop filter 360 accepts input signal 10, and feedback signal 13 from the output of quantizer 229. Output signal 366 of loop filter 360 drives the input of quantizer 229.

Loop filter 360 includes, in general, integrators 363A-363N, arranged in a cascade configuration. Integrators 363A-363N may include a mix of continuous-time and discrete-time integrators, as desired. Note that, as persons of ordinary skill in the art who have the benefit of the description of the disclosed concepts understand, FIG. 5A shows a simplified block diagram of delta-sigma modulator 100, and omits some circuitry, for example, summing circuits, gain blocks, feed-forward or feedback circuits, etc. The details of such circuits fall within the level of skill and knowledge of persons of ordinary skill in the art who have the benefit of the description of the disclosed concepts.

At least one of integrators 363A-363N constitutes a lossy integrator. In one embodiment, delta-sigma modulator 100 includes a plurality of lossy integrators, say, two, three, or more lossy integrators. In another embodiment, delta-sigma modulator 100 includes two lossless integrators, and the rest of the integrators constitute lossy integrators. As persons of ordinary skill in the art who have the benefit of the description of the disclosed concepts understand, one may use a wide variety of integrator configurations, as desired, depending on factors such as the design and performance specifications for a given application.

Figure 5B:
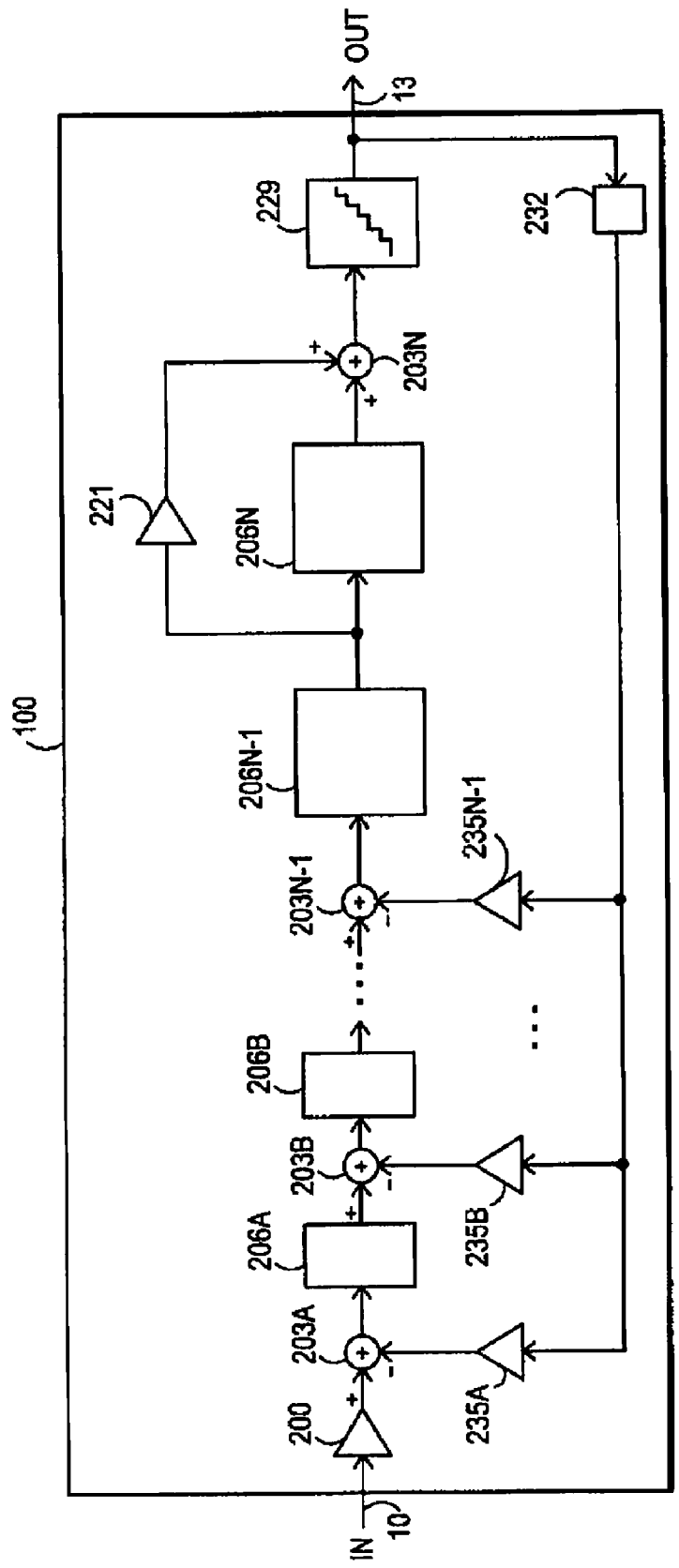
FIG. 5B illustrates a more detailed block diagram of an N-th delta-sigma modulator according to an illustrative embodiment.

FIG. 5B illustrates a more detailed block diagram of an N-th order delta-sigma modulator according to an illustrative embodiment. Rather than a fourth-order modulator (see FIG. 2), the diagram in FIG. 5B illustrates an N-th order delta-sigma modulator 100, where N denotes a positive integer greater than unity.

In addition to the circuitry shown in FIG. 5B, depending on the value of N (order of delta-sigma modulator 100), as persons of ordinary skill in the art who have the benefit of the description of the disclosed concepts understand, delta-sigma modulator 100 may include additional circuitry, for example, additional feed-forward and feedback paths or circuits. Details of such circuitry fall within the knowledge and level of skill of persons of ordinary skill in the art who have the benefit of the description of the disclosed concepts.

Referring to FIG. 5B, delta-sigma modulator 100 includes a plurality of integrators, labeled as 206A-206N, coupled in a chain or cascade configuration that includes a plurality of summing circuits 203A-203N.

In its most basic form, delta-sigma modulator 100 includes at least one continuous-time integrator, and at least one discrete-time integrator. Delta-sigma modulator 100 includes at least one lossy integrator in order to maintain stability, as described above in detail. In one embodiment, delta-sigma modulator 100 includes a plurality of lossy integrators, say, two, three, or more lossy integrators. In another embodiment, delta-sigma modulator 100 includes two lossless integrators, and the rest of the integrators constitute lossy integrators. As persons of ordinary skill in the art who have the benefit of the description of the disclosed concepts understand, one may use a wide variety of integrator configurations, as desired, depending on factors such as the design and performance specifications for a given application.

Delta-sigma modulator 100 also includes gain blocks or circuits 200, 221, and 235A-235N-1. In addition, delta-sigma modulator 100 includes quantizer 229, and delay block or circuit 232.

Generally speaking, gain circuits 200, 221, and 235A-235N-1 may constitute coefficients in an overall transfer function of delta-sigma modulator 100. The coefficients determine, in part, the location of the poles and zeroes of the transfer function and, hence, the stability of delta-sigma modulator 100.

Gain circuit 200, with a gain of $a_0$, accepts the input signal of delta-sigma modulator, applies the gain $a_0$ to it, and provides the resulting signal to summing circuit 203A. Gain circuits 235A-235N-1, with gains of $f_1$ through $f_{N-1}$, respectively, are arranged in a feedback loop, and scale the output of delay circuit 232, and provide the resulting signal to summing circuits 203A-203N-1.

Summing circuit 203A provides at its output the difference between the output signal of gain circuit 200 and the output signal of gain circuit 235A. Integrator 206A accepts the output signal of summing circuit 203A, processes that signal, and provides an output signal. Integrator 206A has a transfer function given by:

$$\frac{a_{1c}}{sT},$$

where $a_{1c}$ denotes a continuous-time coefficient, s represents the Laplace variable, and T denotes a time unit or sampling interval.

One may repeat the integrator-summing circuit configuration a desired number of times, as persons of ordinary skill in the art who have the benefit of the description of the disclosed concepts understand. The number of such configurations depends on the order of the transfer function of the overall delta-sigma modulator, as persons of ordinary skill in the art who have the benefit of the description of the disclosed concepts understand.

Generally speaking, the higher the order of the transfer function of the delta-sigma modulator, the higher the number of lossy integrators used to maintain stability. Furthermore, increasing the number of integrators tends to decrease the maximum magnitude of the input signal at which the delta-sigma modulator still remains stable. On the other hand, using more integrators improves the signal-to-use ratio (SNR). By balancing factors including the above considerations, one may design delta-sigma modulators with appropriate numbers of integrators overall and an appropriate number of lossy integrators to meet the desired design and performance specifications, as persons of ordinary skill in the art who have the benefit of the description of the disclosed concepts understand.

The last integrator in the cascade configuration, labeled as 206N, receives the output signal of the preceding integrator (i.e., integrator 206N-1), processes it, and provides the resulting signal to summing circuit 203N. Integrator 206N has a transfer function given by:

$$\frac{a_{Nd}}{1 - \beta_N z^{-1}},$$

where $a_{Nd}$ denotes a discrete-time coefficient, $\beta_N$ represents a coefficient, and $z^1$ denotes a unit delay. As described above, a value of unity for $\beta_N$ results in a lossless 206N, whereas a value of $\beta_N$ less than unity makes integrator 206N a lossy integrator.

Gain circuit 221 scales the output signal of integrator 206N-1, and provides the resulting signal to another input of summing circuit 203N. Put another way, gain circuit 221 acts as a feed-forward circuit.

Summing circuit 203N adds its two input signals and provides the sum of them to quantizer 229. Quantizer 229 quantizes the output signal of summing circuit 203N, and generates the output signal of delta-sigma modulator. As persons of ordinary skill in the art who have the benefit of the description of the disclosed concepts understand, quantizer 229 may use a variety of quantization levels, as desired.

Delay circuit 232 (with a transfer function of $Z^1$ in the embodiment shown) accepts the output signal of quantizer 229, and delays it by a desired time period (e.g., one time unit or one clock signal), to produce a delayed output signal. Delay circuit 232 provides the delayed output signal to gain circuits 235A-235N-1.

As noted, delta-sigma modulators according to the disclosed concepts include at least one lossy integrator. Thus, in the embodiment shown in FIG. 5B, one or more of integrators 206A-206N constitute lossy integrators. One may make an integrator lossy, as described above, and as persons of ordinary skill in the art who have the benefit of the description of the disclosed concepts understand.

As noted above in the description of FIG. 2, using one or more lossy integrators may reduce the overall gain of delta-sigma modulator 100. On the other hand, using one or more lossy integrators causes the poles of the transfer function of delta-sigma modulator 100 to remain within the unit circle. Consequently, delta-sigma modulator 100 maintains stability even for relatively large signals.

Each of the integrators in exemplary embodiments may constitute discrete-time or continuous-time integrators, as desired. The particular configuration (mix of discrete-time and continuous-time integrators) used depends on the desired design and performance characteristics of a given implementation or use, as persons of ordinary skill in the art who have the benefit of the description of the disclosed concepts understand.

Note that one may alter the configuration and topology of the integrator-summing circuit cascade, such as different partitioning of the discrete-time integrators and the continuous-time integrators, as desired, and as persons of ordinary skill in the art who have the benefit of the description of the disclosed concepts understand. For example, in one embodiment, one may reverse the order of the discrete-time and the continuous-time integrators. The choice of configuration for the integrators depends on a number of factors, such as the desired design and performance characteristics or specifications for a particular use or implementation, as persons of ordinary skill in the art who have the benefit of the description of the disclosed concepts understand.

Rather than using one or more lossy discrete-time integrators, one may use one or more lossy continuous-time integrators, as desired. Typically, a lossy discrete-time integrator has more stable, repeatable, and/or reliable performance characteristics than a lossy continuous-time integrator, as persons of ordinary skill in the art who have the benefit of the description of the disclosed concepts understand.

As noted above, in exemplary embodiments one may use a variety of integrator topologies or designs, as desired. Furthermore, one may implement the integrators using a variety of circuit components, semiconductor fabrication processes, etc., as persons of ordinary skill in the art who have the benefit of the description of the disclosed concepts understand. For example, in one illustrative embodiment, one may implement the discrete-time integrators using switched-capacitor circuitry.

Figure 6:
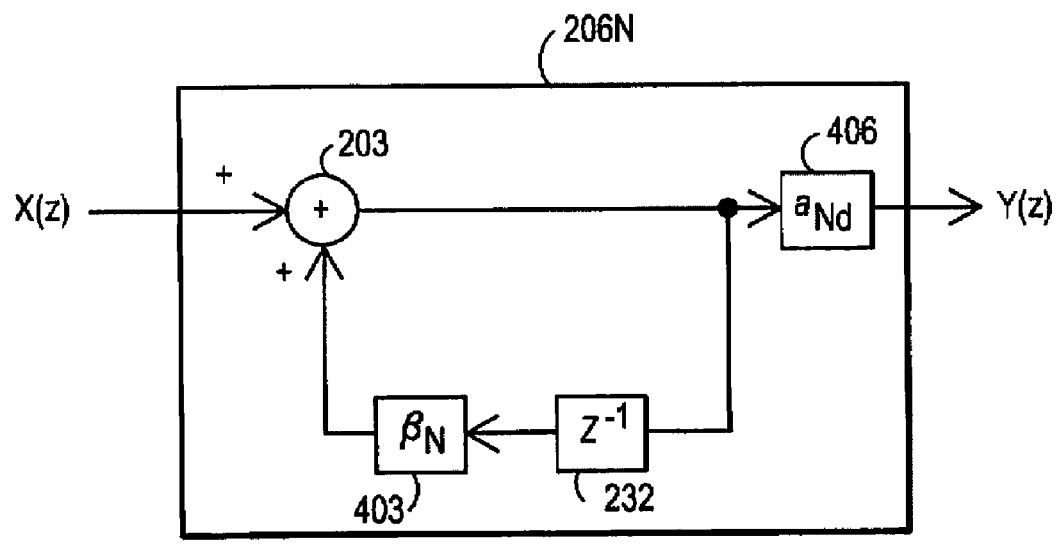
FIG. 6 depicts a simplified block diagram of a discrete-time integrator according to an exemplary embodiment.

FIG. 6 depicts a simplified block diagram of a discrete-time integrator according to an exemplary embodiment. The discrete-time integrator, labeled 206N to denote a general discrete-time integrator in a delta-sigma modulator, includes summing circuit 203, gain block or circuit 406, delay circuit 232, and gain block or circuit 403.

Summing circuit 203 receives the input signal, X(z), of integrator 206N at one of its inputs. Summing circuit 203 adds the input signal to a signal derived using a feedback loop (described below in detail), and provides the result to gain circuit 406. Gain circuit 406 scales the output signal of summing circuit 203, and provides the result as the output signal, Y(z), of integrator 206N.

As noted above, delay circuit 232 and gain circuit 403 are arranged in a feedback loop. Specifically, delay circuit 232 receives the output signal of summing circuit 203. Delay circuit 232 delays that signal, and provides the delayed signal to gain circuit 403. Gain circuit 403 scales the signal received from delay circuit 232 to produce a scaled feedback signal. Gain circuit 403 completes the feedback loop by providing the scaled feedback signal to an input of summing circuit 203.

As persons of ordinary skill in the art who have the benefit of the description of the disclosed concepts will appreciate, integrator 206N has a z-domain transfer function given by:

$$\frac{Y(z)}{X(z)} = \frac{a_{Nd}}{1 - \beta_N z^{-1}},$$

where $a_{Nd}$ denotes the scaling coefficient or gain of gain circuit 406, $\beta_N$ represents the scaling coefficient or gain of gain circuit 403, and $z^1$ denotes a unit delay.

As described above, a value of unity for $\beta_N$ results in a lossless integrator 206N, whereas a value of $\beta_N$ less than unity makes integrator 206N a lossy integrator. One may use this property of integrator 206N to produce delta-sigma modulators with programmable stability.

As noted above, using one or more lossy integrators helps to maintain stability of the delta-sigma modulator, but it also tends to reduce the overall gain of the modulator. Thus, by adjusting the loss (i.e., the loss level in the transfer function) of one or more integrators and/or by making one or more integrators selectably lossy or loss, one may trade off gain for stability.

Figure 7:
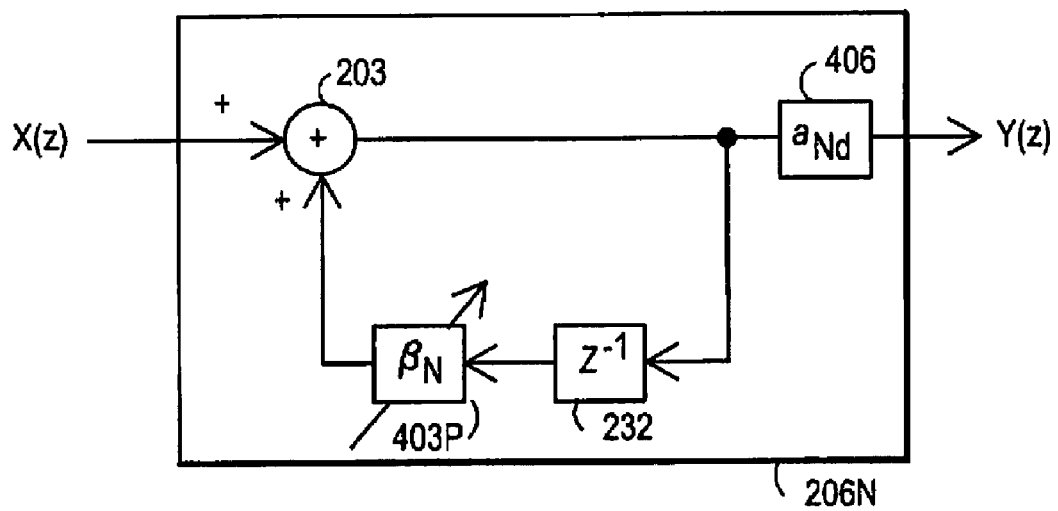
FIG. 7 shows a simplified block diagram of a programmable discrete-time integrator according to an exemplary embodiment.

FIG. 7 shows a simplified block diagram of a programmable discrete-time integrator according to an exemplary embodiment. The discrete-time integrator, labeled 206N to denote a general discrete-time integrator in a delta-sigma modulator. Integrator 206N has a similar architecture and topology as the integrator in FIG. 6, except that it uses a programmable gain circuit 403P.

In other words, while the integrator in FIG. 6 uses gain circuit 403 with a fixed coefficient or gain value, the integrator in FIG. 7 has a gain circuit 403P with programmable or selectable gain or coefficient. Referring to FIG. 7, by varying the gain, $\beta_N$, of integrator 206N, one may adjust or program the "lossiness" of the integrator (i.e., how lossy of a transfer function it has), or even whether it has any loss at all (i.e., select a value of $\beta_N$ of unity).

By using one or more integrators 206N (see FIG. 7) in a delta-sigma modulator (e.g., delta-sigma modulator 100 in FIG. 2 or FIGS. 5A, 5B), one may trade off gain for stability. By increasing the loss level or lossiness in one or more integrators (i.e., by increasing the corresponding $\beta_N$ value(s)), one produces a delta-sigma modulator with enhanced stability, albeit with reduced gain. Conversely, by decreasing the loss level or lossiness in one or more integrators (i.e., by decreasing the corresponding $\beta_N$ value(s)), one produces a delta-sigma modulator with relatively less stability, but with an enhanced gain.

By programming one or more integrators as lossless integrators (i.e., by setting to unity the corresponding $\beta_N$ value(s)), one may select or program the number of lossy integrators used in the delta-sigma modulator. Accordingly, by selecting or programming the gain values ($\beta_N$) for one or more integrators, one may once select or program the relative level of stability of the delta-sigma modulator that uses the integrator(s).

Figure 8:
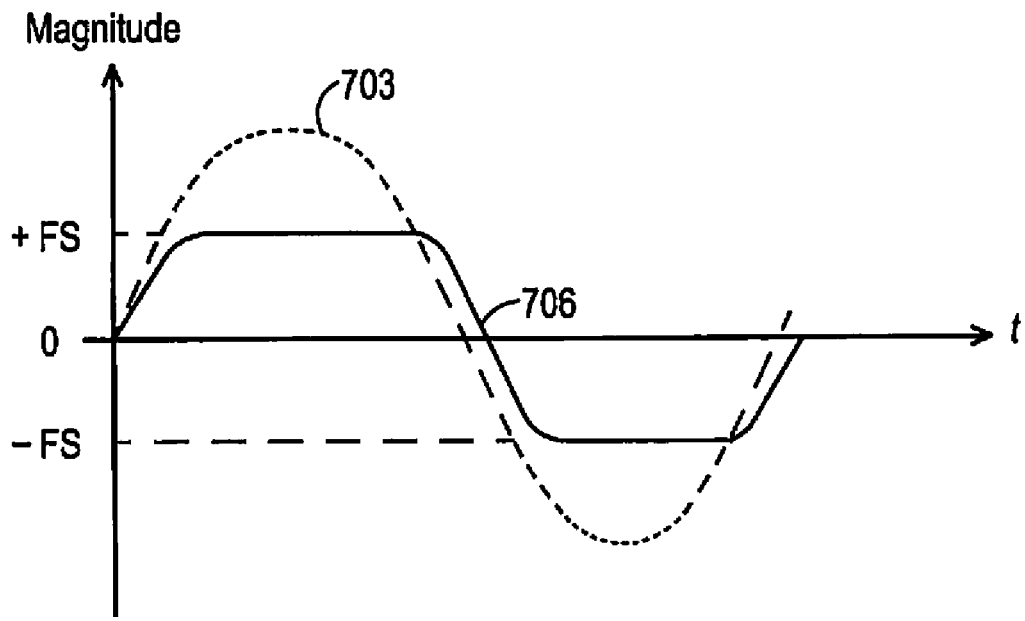
FIG. 8 illustrates representative plots of waveforms from a delta-sigma modulator according to an illustrative embodiment.

Computer simulation confirms the stability of the disclosed delta-sigma modulators that use at least one lossy integrator. FIG. 8 shows representative plots (not drawn to scale) of waveforms from a delta-sigma modulator according to an illustrative embodiment. Specifically, waveform 703 depicts the input signal of the delta-sigma modulator, whereas waveform 706 illustrates the filtered output signal of the modulator (i.e., the signal labeled "Output Signal" in FIG. 1).

Starting at the origin, as the input signal increases in time, the output signal tracks the input signal, until the output signal reaches its positive full-scale value (labeled "+FS"). At that point, the output signal saturates at the positive full-scale value. The output signal stays at the positive full-scale value until the input signal reduces to a sufficiently small value that the output signal can track it again.

The same pattern repeats for negative input signals although, in this scenario, the output signal reaches the negative full-scale value (labeled "−FS"), rather than the positive full-scale value. As FIG. 8 shows, the delta-sigma modulator maintains stability even for relatively large values of the input signal.

Figure 9:
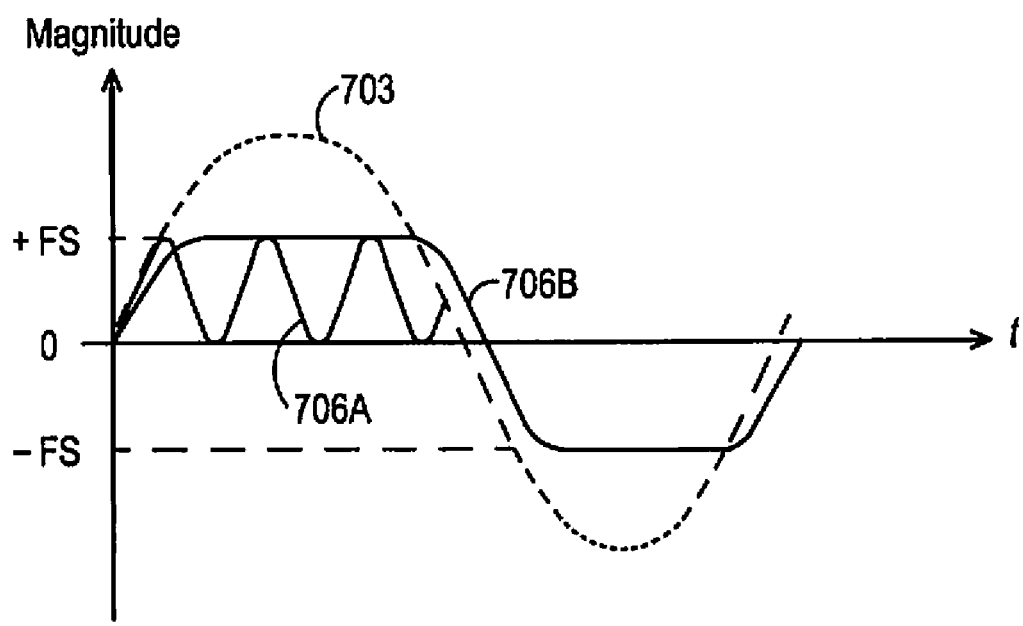
FIG. 9 depicts representative plots of waveforms from a delta-sigma modulator according to an illustrative embodiment that uses a selectable gain or programmable integrator.

FIG. 9 depicts representative plots of waveforms from a delta-sigma modulator according to an illustrative embodiment that uses a selectable gain or programmable integrator. In other words, the delta-sigma modulator uses one or more integrators with selectable or programmable loss levels or lossiness (see FIG. 7), i.e., more or less lossy or lossless, as described above in detail.

Suppose that one programs one or more integrators so as to reduce the level of loss or lossiness in the integrator(s) or to make them lossless. Waveform 706A depicts the filtered output signal of the delta-sigma modulator (e.g., delta-sigma modulator 100 in FIG. 2 or FIG. 5B) with lossless or nearly lossless integrators. In this situation, the delta-sigma modulator might become unstable. In other words, as waveform 706A shows, for relatively small values of the input signal, the output signal tracks the input signal, and the delta-sigma modulator remains stable.

As waveform 706A shows, the output signal tracks the input signal, and is stable, for relatively small values of the input signal. But as the magnitude of the input signal increases beyond a threshold value, however, the delta-sigma modulator becomes unstable. Waveform 706A shows that the output signal oscillates (indicating instability) as the input signal reaches the positive full-scale value. Once delta-sigma the modulator becomes unstable, it can stay continue to oscillate, even if the input signal reduces in value. In such a situation, the modulator needs to be reset in order to restore normal operation. Resetting the delta-sigma modulator takes time, and might result in loss of data.

Now suppose that one either increases the loss level or lossiness in one or more integrators or makes one or more integrators lossy. Given a sufficient level of loss or lossiness for a sufficient number of the integrators, the delta-sigma modulator becomes stable. As waveform 706B shows, the output signal of the delta-sigma modulator tracks the input signal, without oscillation or instability.

As noted above, one may use the disclosed delta-sigma modulators in a variety of circuits and systems, as desired, and as persons of ordinary skill in the art who have the benefit of the description of the disclosed concepts understand. As one example, one may use the disclosed delta-sigma modulators in wireless RF receivers, for instance, receives in mobile units in a cellular communication system.

Figure 10:
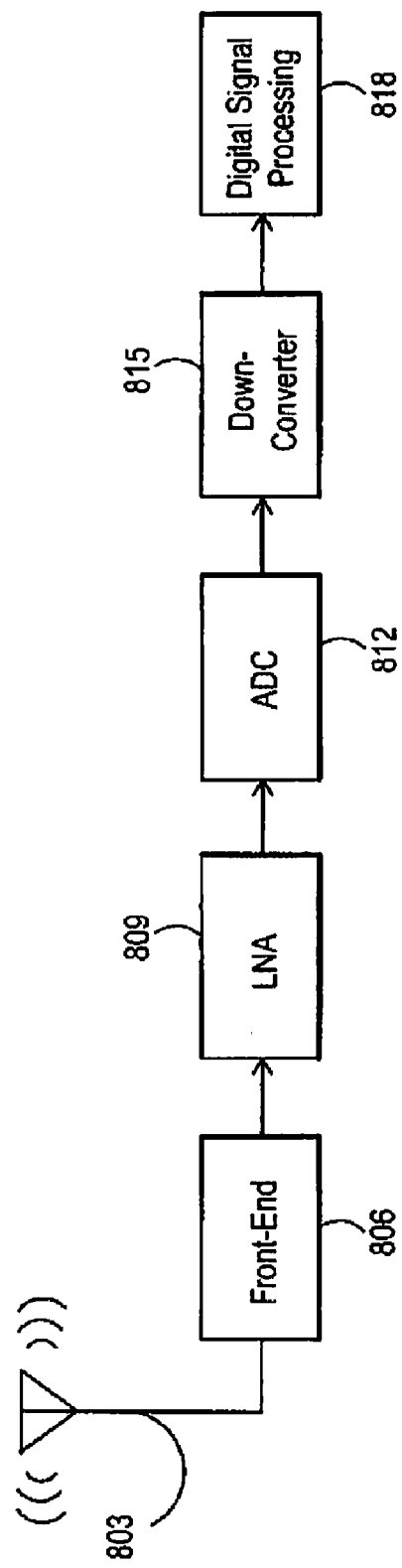
FIG. 10 depicts a simplified block diagram of a radio-frequency (RF) receiver that uses an ADC according to the disclosed concepts.

FIG. 10 depicts a simplified block diagram of a radio-frequency (RF) receiver that uses an ADC according to the disclosed concepts. The receiver includes antenna 803, front-end circuitry 806, low-noise amplifier (LNA) 809, ADC 812, down-converter 815, and digital signal processing (DSP) circuit 818.

Antenna 803 receives RF signals, and supplies them to front-end circuitry 806. Front-end circuitry 806 may include circuits such as filters, switches (in the scenario where the receiver constitutes part of a transceiver), and the like, as persons of ordinary skill in the art who have the benefit of the description of the disclosed concepts understand. Front-end circuitry 806 processes (e.g., filters) the RF signal, and provides the resulting signal to LNA 809.

Typical signals received by an RF receiver, such as a cellular mobile device, have relatively small amplitudes (perhaps on the order of 1 µV/in some systems). LNA 809 amplifies the RF signal to generate an amplified RF signal.

ADC 812 converts the amplified RF signal to a digital signal. ADC 812 uses a delta-sigma modulator according to the disclosed concepts, for example, the delta-sigma modulator of FIG. 2 or FIGS. 5A, 5B. ADC 812 includes at least one lossy integrator.

Down-converter 815 processes the digital output signal of ADC 812 to mix the signal down to baseband frequencies. Down-converter 815 provides the baseband signal to digital signal processing circuit 818. Digital signal processing circuit 818 performs additional signal processing tasks, such as decoding, demodulation, filtering, etc., as persons of ordinary skill in the art who have the benefit of the description of the disclosed concepts understand.

As described above, delta-sigma modulators according to the exemplary embodiments provide enhanced stability. Thus, the receiver of FIG. 10 provides more robust, reliable, and stable operation over a wider range of operating and process conditions.

Figure 11:
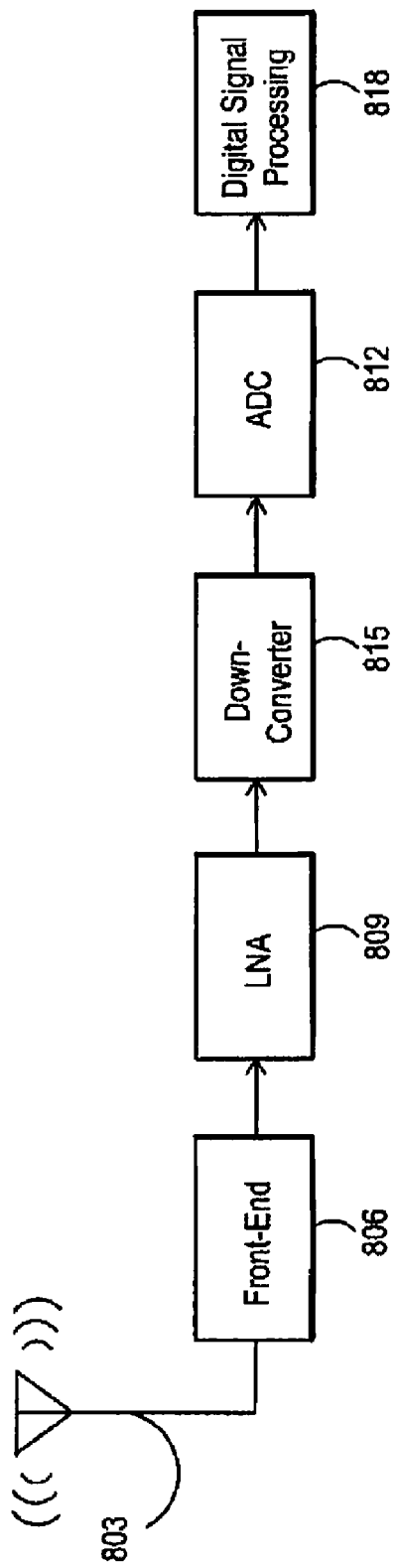
FIG. 11 shows a simplified block diagram of another RF receiver that uses an ADC according to the disclosed concepts.

FIG. 11 shows a simplified block diagram of another RF receiver that uses an ADC according to the disclosed concepts. The receiver includes antenna 803, front-end circuitry 806, low-noise amplifier (LNA) 809, down-converter 815, ADC 812, and digital signal processing (DSP) circuit 818.

The receiver of FIG. 11 performs a similar overall function as does the receiver illustrated in FIG. 10, albeit with a different architecture. Thus, the various blocks of circuitry in FIG. 11 perform similar functions and have like topologies as do the blocks of circuitry in FIG. 10. The receiver in FIG. 11, however, reverses the order of ADC 812 and down-converter 815.

Put another way, down-converter 815 mixes down the output signal of LNA 809 to provide a down-converted signal to ADC 812. ADC 812 converts the down-converted signal to a digital signal, and provides the digital signal to digital signal processing circuit 818.

ADC 812 uses a delta-sigma modulator according to the disclosed concepts, for example, the delta-sigma modulator of FIG. 2 or FIGS. 5A, 5B. ADC 812 includes a delta-sigma modulator that has at least one lossy integrator. Accordingly, the receiver of FIG. 11 provides more robust, reliable, and stable operation over a wider range of operating and process conditions, as noted above.

As persons of ordinary skill in the art who have the benefit of the description of the disclosed concepts understand, one may use a variety of architectures and blocks of circuitry to implement the disclosed delta-sigma modulators, receivers, etc. Examples of such circuitry include digital signal processors (DSPs), logic gates, flip-flops, registers, multipliers, adders, switched-capacitor circuits, operational amplifiers, and the like. Furthermore, one may use a variety of semiconductor fabrication processes, as persons of ordinary skill in the art who have the benefit of the description of the disclosed concepts understand. Examples include bipolar processes, complementary metal oxide semiconductor (CMOS) processes, bipolar-CMOS (Bi-CMOS) processes, etc.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as the presently preferred or illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A delta-sigma modulator, comprising:
   a first integrator; and
   a second integrator that communicates with the first integrator,
   wherein the second integrator is lossy and has a selectable loss level.

2. The delta-sigma modulator according to claim 1, wherein the first integrator is lossless.

3. The delta-sigma modulator according to claim 1, wherein:
   the first integrator comprises a continuous-time integrator; and
   the second integrator comprises a discrete-time integrator.

4. The delta-sigma modulator of claim 1, further comprising a gain circuit that is in a feedforward loop relative to the second integrator,
   wherein:
   the first integrator is a lossless integrator; and
   the second integrator is configured to integrate an output of the first integrator.

5. The delta-sigma modulator according to claim 1, wherein the loss level of the second integrator is selected to maintain stability of the delta-sigma modulator.

6. The delta-sigma modulator according to claim 5, further comprising a quantizer,
   wherein the loss level of the second integrator is selected based on a gain of the quantizer.

7. The delta-sigma modulator according to claim 1, wherein a loss level of the second integrator is selectable to maintain stability of the delta-sigma modulator.

8. The delta-sigma modulator according to claim 1, further comprising:
   a first summing circuit coupled to the first integrator; and
   a second summing circuit coupled to the second integrator.

9. The delta-sigma modulator according to claim 8, further comprising a quantizer coupled to the second integrator.

10. The delta-sigma modulator according to claim 1, wherein the delta-sigma modulator processes radio-frequency (RF) signals of a receiver.

11. An analog-to-digital converter (ADC) comprising the delta-sigma modulator of claim 1, wherein the delta-sigma modulator further comprises a gain circuit that is in a feedback loop relative to one of the first integrator and the second integrator.

12. The delta-sigma modulator of claim 1, wherein the second integrator comprises:
   a summer configured to sum output of the first integrator and a gain signal;
   a first gain circuit configured to scale an output of the summer;
   a delay device configured to delay the output of the summer; and
   a second gain circuit configured to scale an output of the delay device to generate the gain signal.

13. The analog-to-digital converter (ADC) according to claim 11, wherein the gain circuit has selectable gain.

14. The analog-to-digital converter (ADC) according to claim 13, wherein the gain of the gain circuit is selected to program a loss level of the transfer function.

15. The analog-to-digital converter (ADC) according to claim 13, wherein the gain of the gain circuit is selected to maintain stability of the delta-sigma modulator.

16. The analog-to-digital converter (ADC) according to claim 15, wherein the gain of the gain circuit is selected to maintain pole locations of a transfer function of the delta-sigma modulator within a unit circle.

17. The analog-to-digital converter (ADC) according to claim 11, wherein the feedback loop comprises a delay circuit.

18. The analog-to-digital converter (ADC) according to claim 11, wherein the delta-sigma modulator comprises four integrators.

19. The analog-to-digital converter (ADC) according to claim 11, wherein the delta-sigma modulator comprises N integrators, wherein N is a positive integer greater than two.

20. The analog-to-digital converter (ADC) according to claim 11, wherein the at least one of the first integrator and the second integrator with the lossy transfer function is a discrete-time integrator.

21. The analog-to-digital converter (ADC) according to claim 11, wherein the at least one of the first integrator and the second integrator with the lossy transfer function is a continuous-time integrator.

22. The delta-sigma modulator of claim 1, wherein:
   the second integrator comprises a gain circuit; and
   the gain circuit has adjustable gain and adjusts a loss level of the second integrator based on a selected gain.

23. The delta-sigma modulator of claim 1, wherein:
   the first integrator is a lossless continuous time integrator; and
   the second integrator is a discrete time integrator.

24. The delta-sigma modulator of claim 23, further comprising:
   a third integrator that is a lossless continuous time integrator; and
   a fourth integrator that is a lossy discrete time integrator.

25. The delta-sigma modulator of claim 24, wherein:
   the first integrator is configured to generate a first output based on a received signal;
   the third integrator is configured to generate a second output based on the first output;
   the second integrator is configured to generate a third output based on the second output; and
   the fourth integrator is configured to generate a fourth output based on the third output.

26. The delta-sigma modulator of claim 25, further comprising a first gain circuit that is in a feedforward loop relative to the fourth integrator.

27. The delta-sigma modulator of claim 25, further comprising:
   a quantizer configured to generate a quantized output based on the fourth output;
   a delay device configured to generate a delayed output based on the quantized output;
   a plurality of gain circuits configured to scale the delayed output to generate gain signals; and
   a plurality of summers configured to sum the received signal, the first output, and the second output with respective ones of the gain signals.

28. The delta-sigma modulator of claim 25, wherein:
   the first integrator is configured to integrate a first sum of the received signal and a first gain signal;
   the third integrator is configured to integrate a second sum of the first output and a second gain signal;
   the second integrator is configured to integrate a third sum of the second output and a third gain signal; and
   the fourth integrator is configured to integrate the third output.

29. The delta-sigma modulator of claim 1, further comprising:
   a third integrator; and
   a fourth integrator,
   wherein:
      the first integrator is configured to generate a first output based on a received signal;
      the third integrator is configured to generate a second output based on the first output;
      the second integrator is configured to generate a third output based on the second output; and
      the fourth integrator is configured to integrate the third output.

30. A method of maintaining stability of a delta-sigma modulator, the method comprising:
   integrating a first signal with a first integrator of the delta-sigma modulator to generate a second signal;
   integrating the second signal with a second integrator; and
   selecting a loss level of at least of the first integrator and the second integrator.

31. The method according to claim 30, wherein selecting a loss level of the at least one of the first integrator and the second integrator comprises selecting a gain of the at least one of the first integrator and the second integrator.

32. The method according to claim 30, wherein the loss level is selected to maintain stability of the delta-sigma modulator.

33. The method according to claim 30, wherein pole locations of a transfer function of the delta-sigma modulator are within a unit circle.

34. The method according to claim 30, wherein at least one of the first integrator and the second integrator is a lossy discrete-time integrator.

35. The method according to claim 34, wherein at least one of the first integrator and the second integrator is a lossless continuous-time integrator.

36. The method according to claim 30, wherein at least one of the first integrator and the second integrator is a lossy continuous-time integrator.

37. The method according to claim 36, wherein the at least one of the first integrator and the second integrator is a lossless discrete-time integrator.

38. The method according to claim 30, further comprising quantizing the second signal to generate a third signal.

39. The method according to claim 38, further comprising generating a feedback signal by delaying the third signal.

40. The method according to claim 39, further comprising filtering the third signal.

* * * * *